United States Patent
Li

(10) Patent No.: US 11,616,923 B2
(45) Date of Patent: Mar. 28, 2023

(54) ARRAY OF CELLS FOR DETECTING TIME-DEPENDENT IMAGE DATA

(71) Applicant: INIVATION AG, Zürich (CH)

(72) Inventor: Chenghan Li, Zürich (CH)

(73) Assignee: INIVATION AG, Zürich (CH)

(*) Notice: Subject to any disclaimer, the term of this patent is extended or adjusted under 35 U.S.C. 154(b) by 0 days.

(21) Appl. No.: 17/259,387

(22) PCT Filed: Jul. 4, 2019

(86) PCT No.: PCT/EP2019/068044
§ 371 (c)(1),
(2) Date: Jan. 11, 2021

(87) PCT Pub. No.: WO2020/011651
PCT Pub. Date: Jan. 16, 2020

(65) Prior Publication Data
US 2021/0281779 A1 Sep. 9, 2021

(30) Foreign Application Priority Data
Jul. 11, 2018 (EP) ..................................... 18182942

(51) Int. Cl.
*H04N 5/357* (2011.01)
*H04N 5/341* (2011.01)
(Continued)

(52) U.S. Cl.
CPC ....... *H04N 5/357* (2013.01); *H01L 27/14643* (2013.01); *H04N 5/341* (2013.01); *H04N 5/3745* (2013.01)

(58) Field of Classification Search
CPC ...... H04N 5/357; H04N 5/341; H04N 5/3745; H04N 5/378; H04N 5/21; H04N 19/517; H01L 27/14643; G06F 17/15; G06F 7/32
See application file for complete search history.

(56) References Cited

U.S. PATENT DOCUMENTS 8,076,739 B2   12/2011   Schmollngruber et al.
8,780,240 B2   7/2014    Posch et al.
(Continued)

FOREIGN PATENT DOCUMENTS

| JP | 2000-316127 A | 11/2000 |
| JP | 2011-171806 A | 9/2011 |
| KR | 10-2014-0047512 A | 4/2014 |

*Primary Examiner* — Marly S Camargo
(74) *Attorney, Agent, or Firm* — Christensen, Fonder, Dardi & Herbert PLLC

(57) ABSTRACT

A photoarray for detecting time-dependent image data, comprising an array of multiple device cells, wherein each device cell comprises a group of photosensors, each photosensor configured to generate an analog sensor signal dependent on a light intensity at said photosensor, for each photosensor a pixel encoding circuit configured to transform the analog sensor signal generated by said photosensor into a digital pixel information stemming from said photosensor, and a processing unit, which comprises a correlation logic configured to correlate said pixel information stemming from the photosensors of said group of photosensors and to produce as a result a request signal indicating that said cell contains pixel information to be read and/or a pass signal utilized in the processing unit to allow pixel information contained in said cell to be transmitted.

9 Claims, 8 Drawing Sheets

(51) Int. Cl.
*H04N 5/374* (2011.01)
*H04N 5/378* (2011.01)
*H04N 5/21* (2006.01)
*H04N 19/517* (2014.01)
*H01L 27/146* (2006.01)
*G06F 17/15* (2006.01)
*G06T 7/32* (2017.01)
*H04N 5/3745* (2011.01)

(56) References Cited

U.S. PATENT DOCUMENTS

| | | | |
|---|---|---|---|
| 10,133,334 B2 * | 11/2018 | Liu | G06F 3/005 |
| 10,484,628 B2 * | 3/2019 | Zhang | H04N 5/35563 |
| 11,265,490 B2 * | 3/2022 | Romanenko | H04N 5/356 |
| 2007/0109433 A1 | 5/2007 | Yamada et al. | |
| 2014/0320403 A1 * | 10/2014 | Lee | G06T 3/01 |
| | | | 345/156 |
| 2016/0093273 A1 | 3/2016 | Wang et al. | |
| 2016/0274643 A1 | 9/2016 | Liu et al. | |
| 2019/0098274 A1 * | 3/2019 | Douady-Pleven | |
| | | | H04N 9/04517 |
| 2019/0362256 A1 * | 11/2019 | Lang | G06N 7/005 |

* cited by examiner

ARRAY OF CELLS FOR DETECTING TIME-DEPENDENT IMAGE DATA

RELATED APPLICATIONS

The present application is a National Phase entry of PCT Application No. PCT/EP2019/068044, filed Jul. 4, 2019, which claims priority to European Patent Application No. 18182942.5, filed Jul. 11, 2018, the disclosures of which are hereby incorporated by reference herein in their entirety.

FIELD OF THE INVENTION

The invention relates to a photoarray for detecting time-dependent image data.

BACKGROUND OF THE INVENTION

Such a photoarray usually consists of an array of pixels, each of which contains a photosensor, such as a photodiode, and a pixel encoding circuit. The photosensor generates an analog sensor signal corresponding to the incident light intensity. This analog signal is subsequently converted into a digital signal, in the following called a digital signal information, by the pixel encoding circuit.

U.S. Pat. No. 7,728,269 B2 proposed such a photoarray, which encodes the temporal visual contrast of the scene captured by its photosensors. By doing so, temporal redundancy the output data of the photoarray is almost eliminated, thereby producing activity-driven sparse data in the format of ON/OFF events. This means that each event consists of the sign ON/OFF and the pixel coordinates. However, the event-based output from the photoarray described in U.S. Pat. No. 7,728,269 B2 still contains a more than desirable amount of data caused by noise and spatial redundancy, creating noise events and spatially redundant events. Both the noise events and the spatially redundant events are able to dilute the meaningful information, especially when the scene spatial contrast is of the ultimate interest.

It is possible to filter away the noise events through separate signal processing, which can be either implemented in a separate circuit or through software running on a host device. However, effective filtering can only be achieved at considerable computational cost to the host device. Furthermore, all the noise events still need to be sent from the photoarray to the host device by a multiplexed communication bus, leading to a high burden on the communication bus.

To reduce the computational cost on the host computer for filtering away the noise events and the communication burden for transmitting the noise events, a correlation-based noise event filtering algorithm may be implemented into a programmable logic device, which is separate from both the photoarray and the host device. In US 2016/0274643 A1, noise event filter based on a spatiotemporal correlation principle is proposed. While lowering the burden to the host device and its communication bus, such a hardware implementation of a spatiotemporal correlation based noise event filter still requires all events to be transmitted from the photoarray to a secondary device before the noise events can be filtered away. Therefore, the multiplexed communication bus from the photoarray to the secondary device is still burdened by the noise events. This can in extreme cases, i.e. when the communication bus cannot transmit all events in a desired time frame, compromise the effective operation of the photoarray itself. Furthermore, such a spatiotemporal correlation based noise event filtering algorithm is also unable to filter away spatially redundant events.

SUMMARY

It is an objective of the present invention to suggest a device, which is able to filter away noise events and possibly also spatially redundant events that might occur on a photoarray, while lowering the burden on the host device reading out the photoarray, as well as the burden on the communication bus connecting the photoarray and the host device.

This objective is met according to the present invention by providing a photoarray with the features of claim 1. Further advantageous embodiments of the invention are subject of the sub-claims.

According to the invention, the photoarray comprises an array of multiple device cells. Each device cell comprises a group of pixels and a processing unit. Each pixel comprises a photosensor and a pixel encoding circuit. Each photosensor, being e.g. a photodiode or a phototransistor, continuously generates an analog sensor signal, which is dependent on a light intensity of light impinging on said photosensor. In order to obtain digital signals for further digital processing, the pixel encoding circuit transforms the analog sensor signal generated by said photosensor into a digital pixel information. In the following, this digital pixel information is identified as digital pixel information or pixel information stemming from said photosensor.

A unit of a photosensor and a following pixel encoding circuit may be specified as a pixel, which generates the pixel information. Thus the photoarray of the invention in fact comprises an array of pixels, each of which comprises a photosensor and a pixel encoding circuit for that photosensor, which are grouped together such that the photoarray simultaneously comprises an array of device sells. As an example, a photoarray for high definition applications may comprise 1280 times 720 pixels (or photosensors). If the group size is 4, thus each device cell contains a sub-array of 2 times 2 pixels (or photosensors), then this would correspond to an array of 640 times 360 device cells (or processing units) in the said photoarray.

As explained above, the pixel information generated by the pixel encoding circuit may be superposed by a noise event and/or a spatially redundant event. A noise event may arise when transistor thermal noise and junction leakage in the pixel cause a transduced internal electric signal, which corresponds to the temporal intensity change of incident light at the photosensor, to exceed the ON/OFF event detection threshold of the pixel encoding circuit. Spatially redundant events may arise when some regions in the scene detected by the photoarray or the whole scene becomes uniformly brighter or darker, e.g. when parts of the scene or the whole scene is illuminated by increased or decreased light.

Both the noise events and the spatially redundant events dilute the meaningful information, especially when the scene spatial contrast is of the ultimate interest. Furthermore, excessive noise events and spatially redundant events place an unnecessary burden on the communication bus between the pixel array and the host, which in extreme cases may compromise the effective operation of the pixel array, e.g. when the communication bus cannot transmit all events in a desired time frame.

The invention is based on the idea to filter away both noise events and possibly also spatially redundant events in the pixel information by correlating the pixel information stemming from the photosensors of a group. The correlation process or function can be performed on information from two or more photosensors of that group, possibly even encompassing information from all photosensors of that group. A group may in turn comprise at least two photosensors, advantageously more than two, such as 4 photosensors arranged in a sub-array of 2×2 photosensors, or 16 photosensors arranged in a sub-array of 4×4 photosensors.

In order to perform this correlation, each device cell comprises a processing unit, which in turn comprises a correlation logic configured to correlate said pixel information stemming from the photosensors of said group of photosensors and to produce as a result a request signal indicating that said cell contains pixel information to be read. Alternatively, or cumulatively, a pass signal can be produced as a result of the correlation, indicating that pixel information contained in said cell as allowed to be transmitted, e.g. to a host, to a secondary processing unit, or to a further processing device. By correctly configuring the correlation logic, pixel information associated with noise and/or spatial redundancy can be ignored by withholding such a request and/or pass signal, even though there might be pixel information stemming from the corresponding photosensor or photosensors. In other words, only when through the correlation it is determined that the pixel information is not noise or spatially redundant information, will the correlation logic produce as a result a request signal and/or a pass signal, thus indicating that said device cell contains pixel information to be read, i.e. indicating that some or all of pixels of the group in the device cell can and/or should be read out. In that case, the corresponding pixel information is transmitted from the photoarray to a host device for further processing.

Said information filtering or event filtering is performed in a pixel-parallel fashion in the pixel array, before any pixel information is sent out, e.g. by a multiplexed communication bus, hence minimizing the communication load on the bus and on the photoarray. Advantageously, the meaningful events (i.e. non-noise and/or non-spatially-redundant pixel information) are sent in groups, instead of being sent individually, hence increasing the throughput of the communication bus.

To filter away noise events, the correlation logic exploits spatio-temporal correlation differences between noise and non-noise events. Noise events arise randomly in both spatial and temporal regard, hence are spatio-temporally uncorrelated. Non-noise events mean events caused by actual scene visual stimulus, which are usually spatio-temporally correlated (i.e. non-noise events usually arise adjacent to each other at relatively the same time). The correlation logic therefore filters away events that are spatio-temporally uncorrelated, and only passes spatio-temporally correlated events for subsequent processing.

Furthermore, spatially redundant events are usually extremely spatio-temporally correlated. For example, if the entire scene illumination suddenly increases, an event will arise in every pixel of the entire photoarray at the same time. These events are spatially redundant and do not convey any spatial contrast information. The correlation logic therefore filters away events that are extremely spatio-temporally correlated, and only passes moderately spatio-temporally correlated events for subsequent processing.

In an advantageous embodiment, two or more photosensors of said group of photosensors are arranged adjacent to each other. In other words, the two or more photosensors are in fact spatially grouped together inside the photoarray. It is also possible that all photosensors of said group are also spatially grouped together. In both cases, two groups can spatially overlap, in particular at group edges, by having photosensors of one group spatially interspersed with the photosensors of the second group. In a simplified one dimensional (1D) example, if there are two groups A and B of photosensors, each having 4 photosensors, the photosensors can be arranged as AABABABB, where each letter denotes the group the photosensor belongs to.

In some embodiments, it might be advantageous if photosensors are reused. A photosensor can thus send its output to multiple groups. In other words, the same photosensor then belongs to multiple different groups. So in the previous simplified 1D example, there can be less than 8 photosensors to support 2 groups, the photosensors being arranges as AA(A&B)(A&B)BB, where (A&B) indicates that the photosensor sends its output to both group A and B. The more interspersed or shared the photosensors are, the more spatially continuous the output will be, however, the wiring/connections within the photoarray can become more complicated.

According to a preferred embodiment, the multiple device cells are divided into multiple sets of cells, in particular arranged in a matrix of cells, having rows and columns of cells. Each set of cells further includes a secondary processing unit placed at an end of said set of cells, in particular at the end of a column of cells. Each secondary processing unit comprises a secondary correlation logic configured to correlate said pixel information stemming from the photosensors of said group of photosensors of a selected cell of said cells and produce as a result a request signal indicating that said selected cell contains pixel information to be read. In other words, a number of processing units share a single secondary processing unit. The processing units may in this case be called primary processing units, because the pixel information first enters them, before being relayed to the secondary processing unit.

The secondary correlation logic of the secondary processing unit advantageously correlates one cell at a time. Because the readout of the entire matrix can be performed by scanning row by row, the secondary processing unit at the end of the column does the secondary filtering of a single cell every time when a row is selected for readout. Therefore, the request signal from the secondary processing unit indicates the particular cell of that column and the currently selected row contains information after two stages of filtering, namely one filtering by the correlation logic in the primary processing unit and a second filtering by the secondary correlation logic in the secondary processing unit.

Alternatively or in addition to the request signal, at least one pass signal may be generated, which is utilized in the secondary processing unit to allow pixel information contained in said selected cell to be transmitted. Advantageously, the secondary correlation logic may produce two pass signals, indicating not only that pixel information may be transmitted, but also what kind of pixel information may be transmitted. E.g., the pixel information from a single pixel may have an ON value, an OFF value or a neutral value. The ON value indicates that the pixel has detected an increase of its incident light by a predetermined threshold, the OFF value indicates that the pixel has detected a decrease of its incident light by a predetermined threshold, and the neutral value indicates that there has been no change (exceeding the predetermined threshold) in incident light detected by the pixel. In this case, there can be a pass(ON) signal, indicating that the ON values from the group of pixels are meaningful (non-noise and/or non-spatially redundant), and a pass(OFF) signal, indicating that the OFF values from the group of pixels are meaningful.

In this embodiment, the correlation logic of the primary processing units may be implemented in a simpler way, e.g. being only configured to correlate all events in a polarity-blind fashion, while the processing units can be implemented in a more complex way, e.g. being configured to correlate on-events and off-events separately, i.e. separating the events according to polarity. An on-event denotes the incident light intensity increase at the pixel exceeds an ON threshold, while an off-event denotes the opposite, the incident light intensity decrease at the pixel exceeds an OFF threshold. A pixel information advantageously contains two bits, namely an ON and an OFF signal. ON=1, OFF=0 denotes an ON event, while ON=0, OFF=1 denotes an OFF event, and ON=0, OFF=0 means no event. In particular, ON and OFF should not both be equal 1. Therefore, an ON/OFF event is encoded by the pixel information, which indicates a temporal change of the incident light.

The multiple sets of cells can be arranged in a matrix fashion. In this matrix, a set of cells may comprise a number X of cells arranged in a column, such that at the end of the column, a corresponding second processing unit for that column of cells is placed. Thus the entire photoarray is divided into sub-arrays or cells, each of which having a primary processing unit, while a column of cells in turn has a secondary processing unit. Each individual primary processing unit may generate a row request signal when the corresponding cell contains one or more events to be read, an internal pass signal to allow the events in the corresponding cell to be read, and receive a row select signal from the host as an indicator for a read-out. Each secondary processing unit may generate a column request signal, two internal pass signals pass(ON) and pass(OFF) and receive a column select signal.

Preferably, said correlation logic and/or said secondary correlation logic are/is implemented by combinational logic. This means in particular that the implementation is done with Boolean circuits and that the output of the corresponding logic is a pure function of the present input at any given time. In other words, the correlation logic and/or the secondary correlation logic contain no storage or memory elements for storing pixel information.

Said correlation logic and/or said secondary correlation logic are/is preferably implemented as spatio-temporal correlation logic. In a simplified embodiment, the correlation logic and/or said secondary correlation logic are/is implemented as a spatial correlation logic. In particular, such a correlation logic and/or secondary correlation logic can be configured to produce a request signal and/or a pass signal, when a correlation result of said pixel information is equal to or larger than a minimum threshold number (N) and/or smaller than or equal to a maximum threshold number (M). This can in particular mean that the number of events in a group of pixels, i.e. the number of pixels in the group reporting an event, is equal to or larger than N and/or equal to or smaller than M.

In an advantageous embodiment of the photoarray, the pixel information of each pixel is stored before being read by the correlation logic. For this purpose, said processing unit comprises for each photosensor of said group of photosensors an event storage memory, which is configured to store said pixel information stemming from said photosensor. This way, each photosensor of the entire photoarray has a corresponding event storage memory. Preferably, said secondary processing unit comprises for each photosensor of said group of photosensors a secondary event storage memory, which is configured to store said pixel information stemming from said photosensor. In other words, the size of the secondary event storage memory equals that of the first event storage memory. Because each set of device cells has advantageously one single secondary processing unit, the entire photoarray may have as many secondary event storage memory as the number of pixels in a group times the number of sets of device cells.

All events from a group of pixels are read into the corresponding event storage memory of the corresponding device cell in a synchronized fashion, i.e. at the same time. This is also true for the reading of the pixel information into the secondary storage memory of the secondary processing unit. In other words, the entire event storage memory of a processing unit or of a secondary processing unit is filled during the same sampling interval upon a synchronized sample signal. Therefore, the events stored in each processing unit, i.e. in each group, are already temporarily correlated. Thus, it might be enough for the subsequent correlation logic to only perform a spatial correlation in order to function as a spatio-temporal correlation logic. The same applies accordingly to the secondary processing unit and the secondary correlation logic.

Advantageously, said processing unit has a storage memory for each photosensor of the group and said secondary processing unit has a secondary storage memory for each photosensor of said group. In this embodiment, the secondary storage memory may be configured to receive said pixel information from said storage memory. In other words, the pixel information is first read into the storage memory in the primary processing unit and then into the secondary storage memory of the secondary processing unit.

Preferably, said processing unit is configured to receive a selection signal and in response to said selection signal transmit all pixel information that said cell contains to be read in a parallel fashion, if the internal pass signal of that said processing unit is true. In particular, when the processing unit contains an event storage memory, in which the pixel information is stored, and if the internal pass signal of that said processing unit is true, the selection signal may initiate a read-out of the event storage memory either to a communication bus or to the secondary processing unit, if available. In addition or alternatively, said secondary processing unit may be configured to receive a selection signal and in response to said selection signal transmit all pixel information that said set of cells contains to be read in a parallel fashion, if the internal pass signal of that said secondary processing unit is true. Similar to the processing unit, the secondary processing unit may contain a secondary event storage memory, in which the pixel information is stored, e.g. after being read from the event storage memory of said processing unit. In this case, if the internal pass signal of that said secondary processing unit is true, the selection signal may initiate a read-out of the secondary event storage memory to a communication bus.

As mentioned before, the pixel encoding circuit transforms the analog sensor signal generated by the photosensor into the digital pixel information, or event information. According to a preferred embodiment, the pixel encoding circuit is a change detection circuit. In this case, the digital pixel information generated by the pixel encoding circuit indicates a change in the sensor signal generated by the photosensor. This can be implemented with a threshold comparison. For example, each time the analog sensor signal rises or falls by an amount equal or larger that a given threshold, the pixel information may comprise an on signal or an off signal accordingly. For this purpose, the pixel information of each pixel may comprise a two-bit information for distinguishing the polarity of the change and also allow for a neutral signal for instances where no change takes place.

In particular, the change detection circuit may be an analog-to-digital convertor using a differential pulse-code modulation (DPCM) encoding scheme, which is a scheme that encode an analog signal as a stream of pulses, where each pulse represent a change by a fixed amount of the analog signal. Such a change detection circuit was e.g. described in U.S. Pat. No. 7,728,269 B2, which was described in the introduction above.

BRIEF DESCRIPTION OF THE DRAWINGS

Some examples of embodiments of the present invention will be explained in more detail in the following description with reference to the accompanying schematic drawings, wherein.

DETAILED DESCRIPTION

Figure 1:
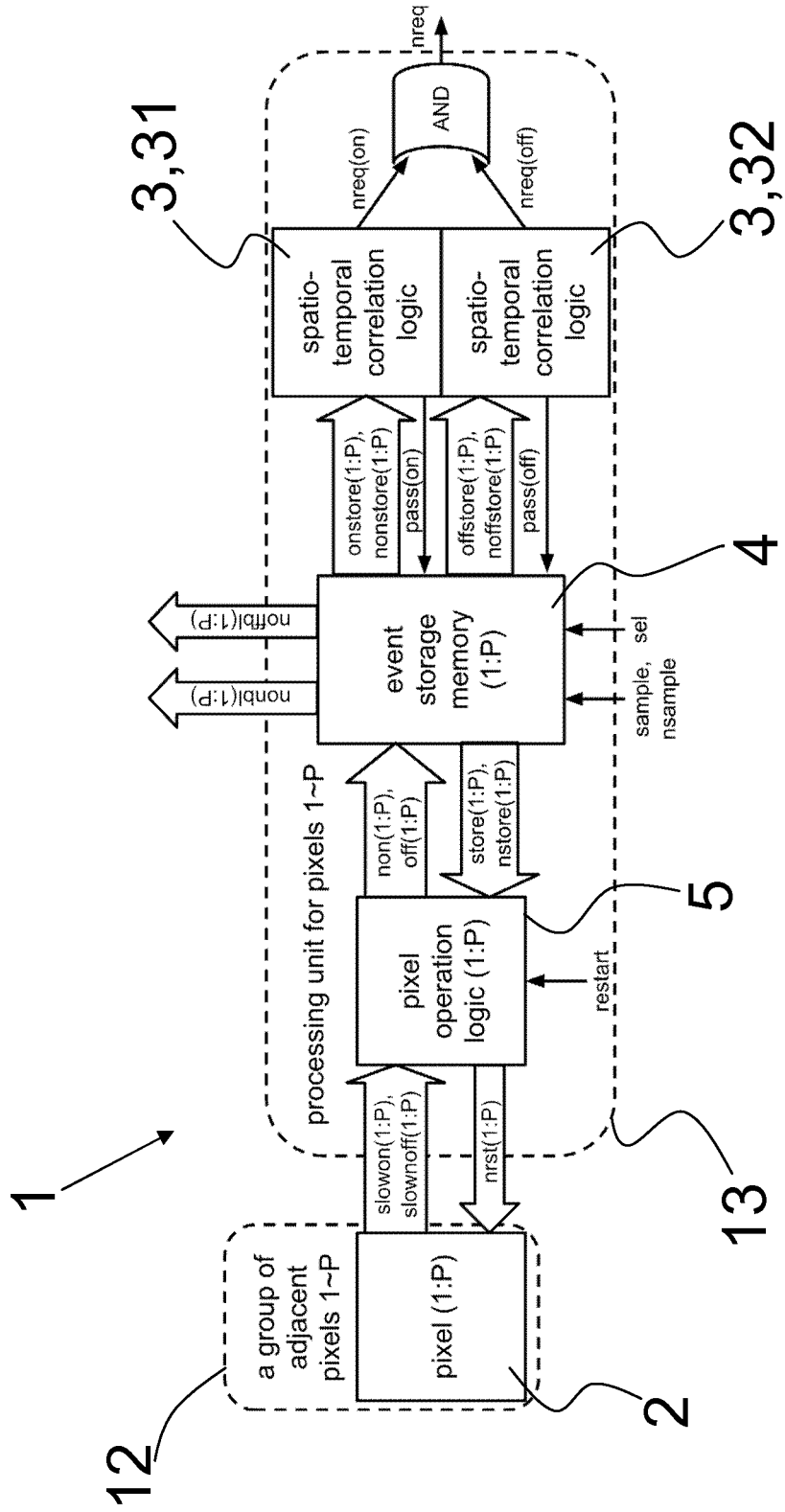
FIG. 1 shows a schematic diagram of the architecture of a device cell with a group of pixels and a processing unit according to one advantageous embodiment.

FIG. 1 shows a schematic diagram of a device cell 1 comprising a group of P adjacent pixels 2 and a processing unit 13 for this group of pixels 2 according to one advantageous embodiment of a photoarray. Each pixel 2 comprises a photosensor and a pixel encoding circuit (both not individually shown in FIG. 1). The processing units 13 of all the groups of device cells 1 form a 2D array, which is incorporated in the 2D array of the photosensors and the pixels 2 of the photoarray.

Each processing unit is made of three parts: a pixel operation logic 5, an event storage memory 4, and the spatio-temporal correlation logic 3. Each pixel 2 has a corresponding pixel operation logic 5 and event storage memory 4 in the processing unit 13. The group of neighboring pixels 2 share the same spatio-temporal correlation logic 3.

It should be noted that a n before an output or input identifier usually means the negation of the corresponding input, output or signal. Therefore while rst may be a reset signal, nrst may be the logically inverted reset signal.

The group of pixels 2 send their outputs slowon(1:P) and slownoff(1:P) to, and receive nrst(1:P) from their corresponding pixel operation logic 5. The pixel operation logic 5 are controlled by the global signal restart, and send their outputs non(1:P) and off(1:P) to their corresponding event storage memory 4, while receiving the signals store(1:P) and nstore(1:P) back from the event storage memory 4. The event storage memory 4 are controlled by the global signal sample/nsample, and the row/column signal set. The event storage memory 4 send their outputs onstore(1:P) and offstore(1:P) to two corresponding spatio-temporal correlation logic 31, 32, which send the signal pass(on) and pass(off) back to the event storage memory 4 to allow readout. While the first spatio-temporal correlation logic 31 correlates all on-events received from the event storage memory 4 to produce the signal nreq(on), the second spatio-temporal correlation logic 32 correlates all off-events to produce the signal nreq(off). The signals nreq(on) and nreq(off) together determine the final output signal nreq to request readout communication bus access for its corresponding row. If pass(on) and pass(off) are true, the event storage memory can be read through the bitline signals nonbl(1:P) and noffbl(1:P) once its corresponding row is selected by the row select signal sel.

Figure 2:
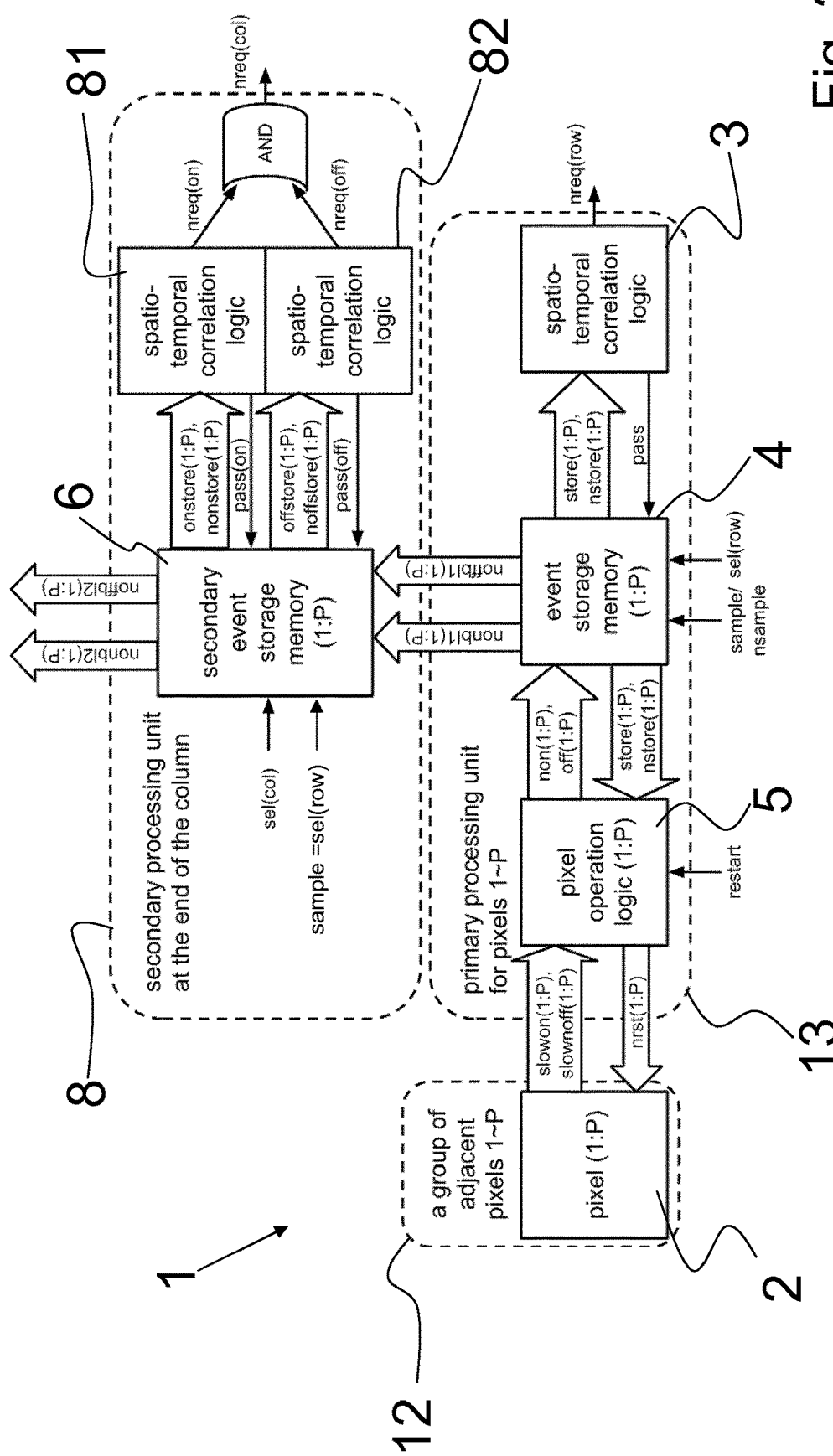
FIG. 2 shows a schematic diagram of the architecture of a device cell with a group of pixels, a processing unit, and a secondary processing unit according to a further advantageous embodiment.

The same spatio-temporal correlation logic 31, 32 circuit can serve both the on-event and the off-event signals onstore (1:P) and offstore(1:P) shown in FIG. 1. However, having two spatio-temporal correlation logic circuits 31, 32 per processing unit 13 occupies significant silicon area. Therefore, FIG. 2 illustrates alternative architecture of a device cell having an alternative processing unit and a secondary processing unit according to a further advantageous embodiment.

In this alternative architecture, there is only one spatio-temporal correlation logic 3 per primary processing unit. A column of such processing units 13 (in the following called primary processing units) share a secondary processing unit 8 at the end of a column. The secondary processing unit 8 comprises a bank of secondary event storage memory 6 and two more spatio-temporal correlation logic circuits 81, 82. The secondary event storage memory 6 has the same size as the event storage memory 4 in order to accommodate all the pixel information stemming from group 12 of the P pixels 2.

The spatio-temporal correlation logic 3 in the primary processing unit takes signals store(1:P) and nstore(1:P) as inputs and produces the signal pass to allow readout from the event storage memory, and the signal nreq(row) to request readout communication bus access for its corresponding row. Hence it does not differentiate between ON and OFF events. It can be said to be polarity-blind. When this row of primary processing units 13 are selected by the row signal sel(row), and if pass is true, the event storage memory 4 is read through the bitline signals nonbl1(1:P) and noffbl1(1:P) into the secondary event storage memory 6 at the end of the column, which further feed into the secondary spatio-temporal correlation logic 81, 82. In other words, the secondary event storage 6 receives a sample signal, which is derived from the sel(row) signal. Therefore, every time a row of primary processing cells is selected, the secondary event storage 6 samples the pixel information from the event storage 4 of the primary processing unit 13 in that selected row. The secondary spatio-temporal correlation logic 81, 82 comprising two circuits and shared by this column perform further filtering on the signed events and produce the signals pass(on) and pass(off) back to the secondary event storage memory 6 to allow readout, and the signal nreq(col) to request readout communication bus access for its corresponding column.

When its corresponding column is selected by the column signal sel(col), and ifpass(on) and pass(off) are true, the events stored in the secondary event storage memory 6 are read out through bitline signals nonbl2(1:P) and noffbl2(1:P). The alternative architecture shown in FIG. 2 reduces the complexity of the primary processing unit 13 array, but at the cost of potential incomplete and/or incorrect event filtering. Because events are processed as unsigned in the primary processing unit 13 array, noise events of different signs may be falsely treated as spatio-temporally correlated events and allowed to pass on; and meaningful events of different signs may be falsely treated as spatially redundant events and filtered away. However, incomplete filtering of noise events is still an improvement over no filtering at all in terms of reducing the traffic burden on the multiplexed bus nonbl1(1:P) and noffbl1(1:P). Furthermore, the spatio-temporal correlation logic 3 in the primary processing unit 13 can be configured to not filter away spatially redundant events, as described later, to prevent incorrectly filtering away meaningful events.

It should be noted that the correlation logic 3 and the secondary correlation logic 81, 82 produce both a request signal and a pass signal. The pass signal is the immediate output of each individual correlation logic 3, 81, 82, and is meant to control its corresponding event storage memory 4, 6. The request signal is the output of one or multiple processing units 13, 8, derived from its/their pass signal(s), and is meant to request bus access time.

As a first example, a row of processing units might share a single row request signal. The shared row request signal will be 1 as long as at least one processing unit 13 in this row has pass=1 internally, i.e. row request=OR(all the individual pass signals in this row). And when this row is selected, it is the individual internal pass signal that determines which processing unit 13 can send its information out. A row can only be selected when its request=1.

As a second example, a secondary processing unit 8 may contain two polarity sensitive correlation logic circuits 81 and 82, hence a pass(ON) signal and a pass(OFF) signal internally. The output of the secondary processing unit 8 is the column request signal. The column request will be 1 when either pass(ON)=1 OR pass(OFF)=1. And when this secondary processing unit 8 is selected, its internal pass(ON) and pass(OFF) signals determine if the ON or OFF information can be read out. The secondary processing unit 8 can only be selected when its column request=1.

Figure 3:
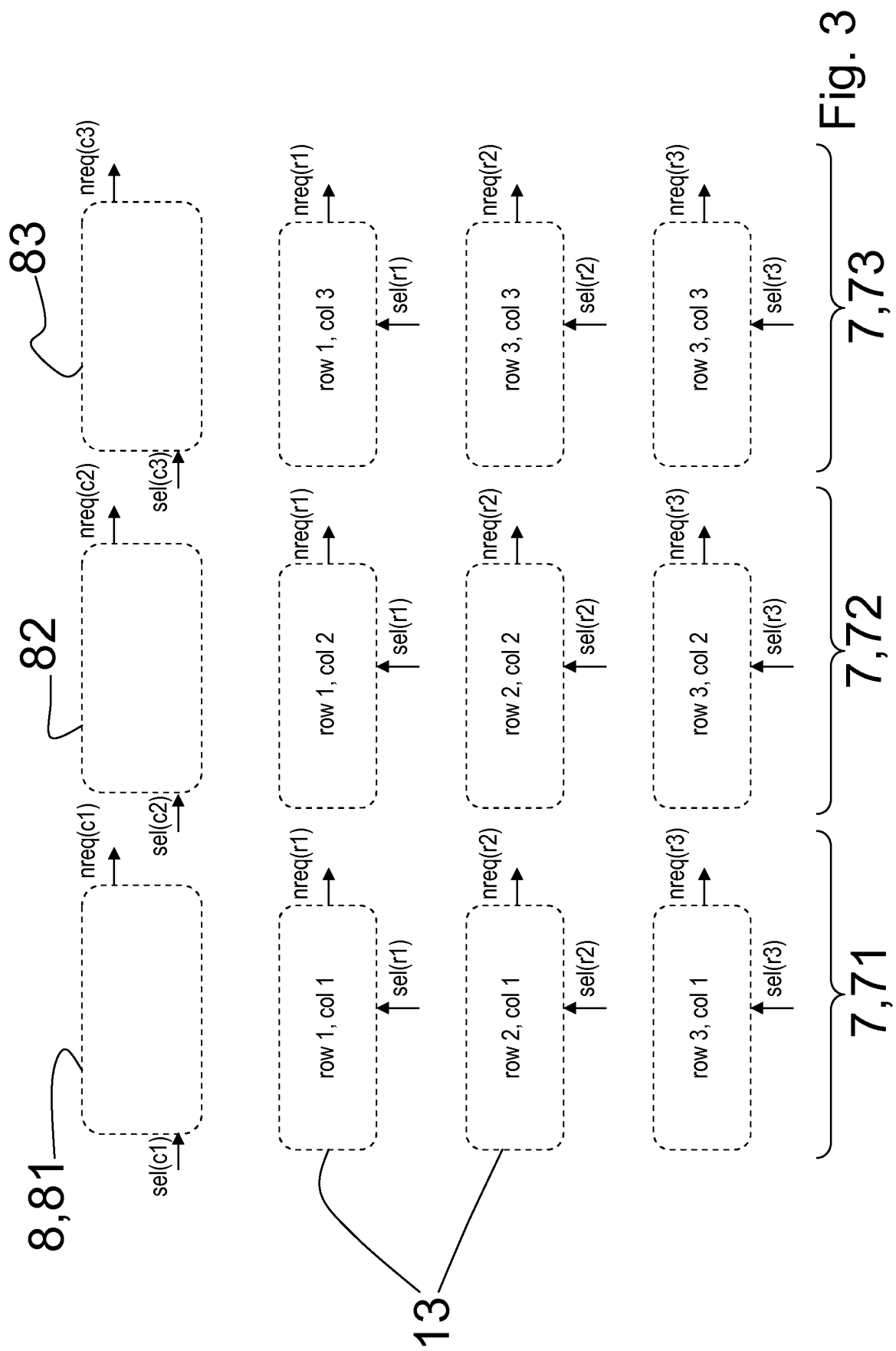
FIG. 3 shows a schematic diagram of multiple sets of device cells arranged in a matrix fashion with secondary processing unit at the end of each column of device cells, according to yet a further advantageous embodiment.

FIG. 3 serves to better illustrate the architecture of the photoarray according to the embodiment described above and shown in FIG. 2. FIG. 3 shows a schematic diagram of multiple sets 71, 72, 73 of device cells arranged in a matrix fashion with a secondary processing unit 81, 82, 83 at the end of each column of device cells. The photoarray comprises a matrix or array of primary processing units 13, which are arranged in rows and columns. In the FIG. 3, an array of 3×3 primary processing units 13 is shown. The group of pixels 12 of each device cell is omitted in FIG. 3 for clarity purposes, or it may be regarded as part of each primary processing unit 13 shown in FIG. 3.

Each set 7 of device cells is arranged as a column of device cells, at the end of which a secondary processing unit 8 is arranged. For example, at the end of a first set 71 of device cells or primary processing units 13, a first secondary processing unit 81 is arranged, etc. The correlation logic 3 of each primary processing unit 13 generates a row request signal nreq(r1), nreq(r2), nreq(r3) to indicate that the corresponding row of device cells has information to transmit, namely row 1, row 2 and/or row 3. If, on the other hand, a selected cell of a certain column of device cells, i.e. any of the pixels in said selected device cell, has information to transmit, then the corresponding secondary processing unit 8 will generate a column request signal nreq(c1), nreq(c2), nreq(c3). For example, when the second row is selected by the signal sel(r2), then the cell with row 2 and col 2 is a selected cell for the second secondary processing unit 82. If this selected cell contains a pixel with information to transmit, the second secondary processing unit 82 will generate a corresponding column request signal nreq(c2).

Therefore, the secondary processing unit performs second stage filtering during a row-by-row scanning readout. If row 1 and row 3 have information, when row 1 is selected, the information of the whole row 1 goes into the secondary processing units 81, 82, 83. I.e, the information from row 1, col 1 is read into the first secondary processing unit 81, the information from row 1, col 2 is read into the second secondary processing unit 82, and information from row 1, col 3 is read into the third secondary processing unit 83. Then the secondary processing units 81, 82, 83 further determine which column actually has information. E.g. only column 2 of row 1 may contain information, or none of the cells in row 1 may have information after the polarity based secondary filtering. After row 1 is read out, row 3 may be selected and the secondary processing units 81, 82, 83 then process the information from row 3.

Figure 4:
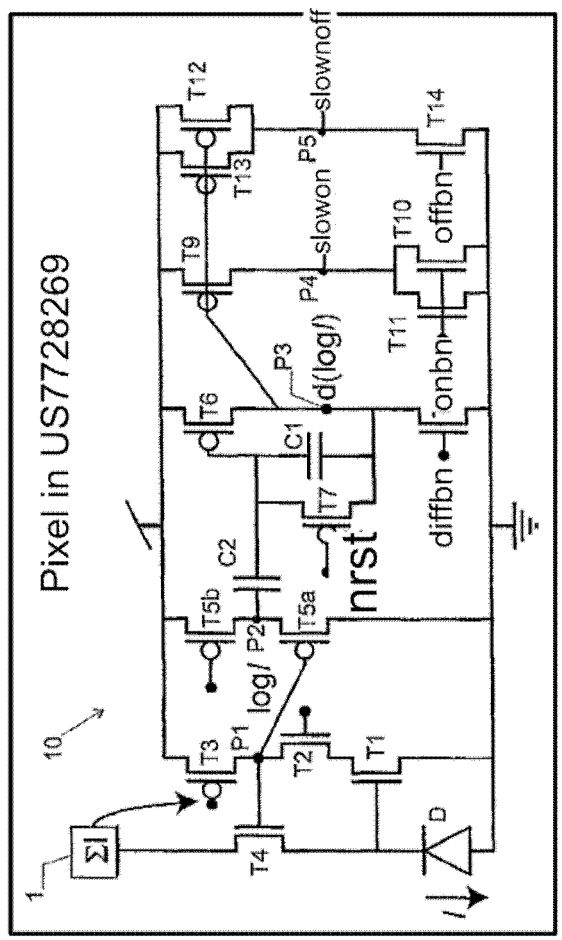
FIG. 4 shows a schematic diagram of a pixel according to state of the art.

FIG. 4 shows a schematic of a pixel circuit belonging to the prior art, which was described in U.S. Pat. No. 7,728,269 B2. It contains a photodiode D as a photosensor, and a pixel encoding circuit, which produces the outputs slowon and slowoff.

Figure 5:
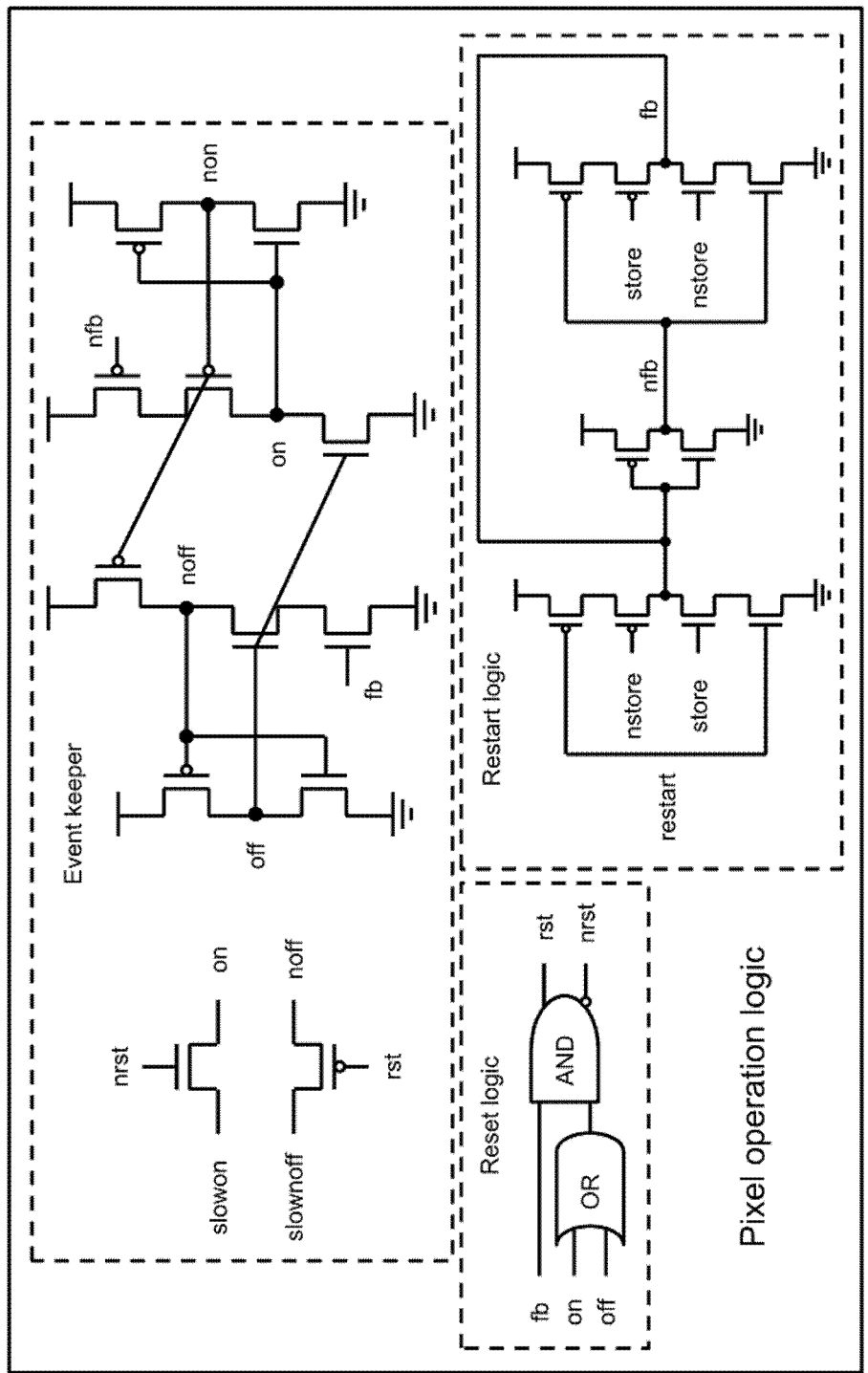
FIG. 5 shows a schematic of a pixel operation logic utilized in the processing unit according to one preferred embodiment.

FIG. 5 shows a schematic of a pixel operation logic 5 according to a preferred embodiment. The pixel operation logic 5 controls the operation of a temporal/spatio-temporal visual contrast sensing pixel. When the pixel detects a change in its internal transduced electric signal, corresponding to the logarithmic value of an incident light induced photocurrent, which exceeds a predetermined ON/OFF event threshold, the pixel operation logic 5 keeps the detected events and puts the pixel into reset state.

The pixel operation logic 5 can be further divided into 3 sub-circuits, each framed in a dashed box in FIG. 5: the event keeper, the reset logic, and the restart logic. When the pixel produces an ON or OFF signal, slowon=1 or slowoff=0, the event keeper will latch in the state of on=1 or off=1, keeping one signed event exclusively (assuming fb=1 and nfb=0). At the same time, the reset logic will set a reset signal rst=1 and nrs=0 (assuming fb=1), putting the pixel in reset state. The pixel will remain in reset state, until it receives a global pulse signal restart. When restart=1, the restart logic sets fb=0 and nfb=1 (assuming store=1 and nstore=0), which further disables the positive feedback mechanism in the event keeper and sets rst=0 and nrst=1. When restart returns to 0, the restart logic sets fb=1 and nfb=0 (assuming store=1 and nstore=0), which enables the event keeper and the reset logic again. Therefore, the moment when a pixel in reset state can resume to a contrast detection state is determined by the global pulse signal restart. The signals store and nstore come from the event storage memory 4.

Figure 6:
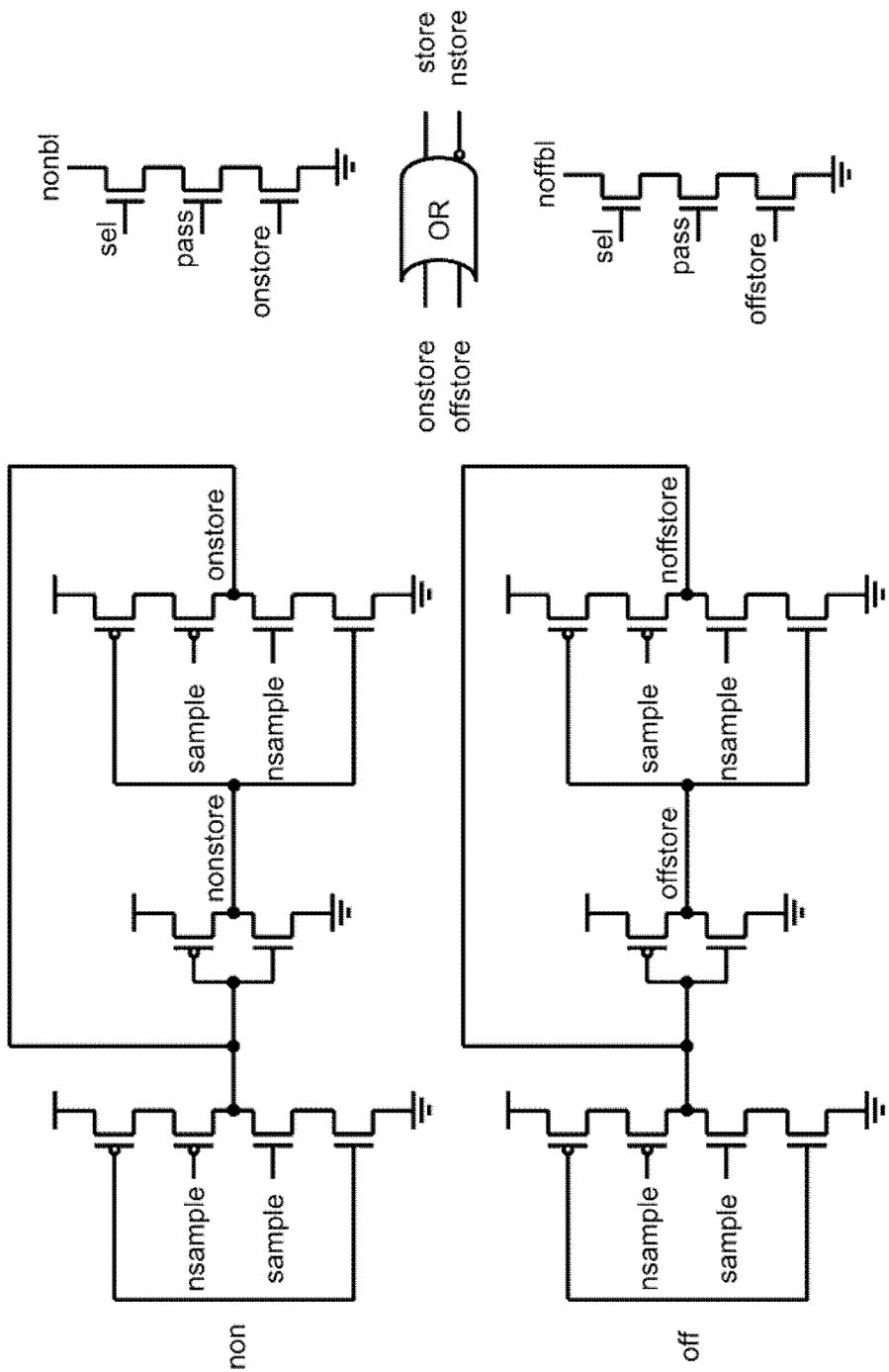
FIG. 6 shows a schematic diagram of an event storage memory utilized in the processing unit according to one preferred embodiment.

FIG. 6 shows a schematic of the event storage memory 4 and/or of the secondary event storage memory 6 according to a preferred embodiment. The moment when the pixel operation logic 5 can write the detected event into the event storage memory 4, 6 is determined by the global signal sample and nsample (nsample is the inverted signal from sample).

After the sample pulse, if the event storage memory has stored an ON/OFF event, store=1 and nstore=0, then the restart logic in the pixel operation logic will put the pixel from reset state back into a contrast detection state following the restart pulse. If the pixel has not detected any event, the event storage memory has not stored an event. After the sample pulse, store=4 and nstore=1, then the restart logic in the pixel operation logic ignores the restart signal, and the pixel remains in the contrast detection state. If the pixel has only detected an ON/OFF event after the sample pulse but before the restart pulse, even though the pixel operation logic 5 has put the pixel into reset state, it will still ignore the restart signal and the pixel will remain in reset state, because the pixel operation logic 5 still holds a detected event and has not been able to write it into the event storage memory (store=0 and nstore=1).

The event storage memory is read when sel=1 and pass=1, through two bitlines nonbl and noffbl. The signal sel is a row/column select signal. The signal pass comes from the spatio-temporal correlation logic 3, 8, 81, 82.

The spatio-temporal correlation logic 3, 8, 81, 82 reads the event storage memories 4, 6 of all the pixels in its group, and determines after each sample pulse, whether the events stored in this group shall be passed to the readout communication bus or filtered away.

The global synchronized sample signal implies that the events stored in each group after each sample pulse are already temporally correlated, because they arise within the same sampling interval. Therefore, the spatio-temporal correlation logic 3, 8, 81, 82 further determines whether the stored events shall pass based only on their spatial correlation, approximated by the number of stored events in the event storage memory 4, 6 of the device cell. The decision criteria can be configured as a combination of two optional conditions:

1. If there are less than a minimum threshold number N of events stored in the device cell, these events are considered noise events and filtered out. Here, N is larger than 1 and smaller than the total number P of pixels in the device cell. (first optional condition)
2. If there are more than a maximum threshold number M of events stored in the device cell, these events are considered spatially redundant events and filtered out. Here, M is larger than N and smaller than the total number P of pixels in the device cell. (second optional condition)

If the spatio-temporal correlation logic 3, 8, 81, 82 is configured to execute both of the two optional conditions, it will only pass the stored events if the number of the stored events in the group is between N and M, including N and M. If the spatio-temporal correlation logic 3, 8, 81, 82 is configured to execute none of the two optional conditions, it will pass any stored event as long as there is at least one stored event in the group. If only the 1st optional condition. is executed, the spatio-temporal correlation logic 3, 8, 81, 82 will pass any stored events as long as there are at least N stored events in the device cell. If only the 2nd optional condition. is executed, the spatio-temporal correlation logic 3, 8, 81, 82 will pass any stored events as long as there are no more than M stored events in the device cell. The same spatio-temporal correlation logic 3, 8, 81, 82 can be used for processing ON events (onstore(1:P) and nonstore(1:P)), OFF events (offstore(1:P) and noffstore(1:P)) or unsigned events (store(1:P) and nstore(1:P)) as shown in FIG. 1 and FIG. 2.

Figure 7:
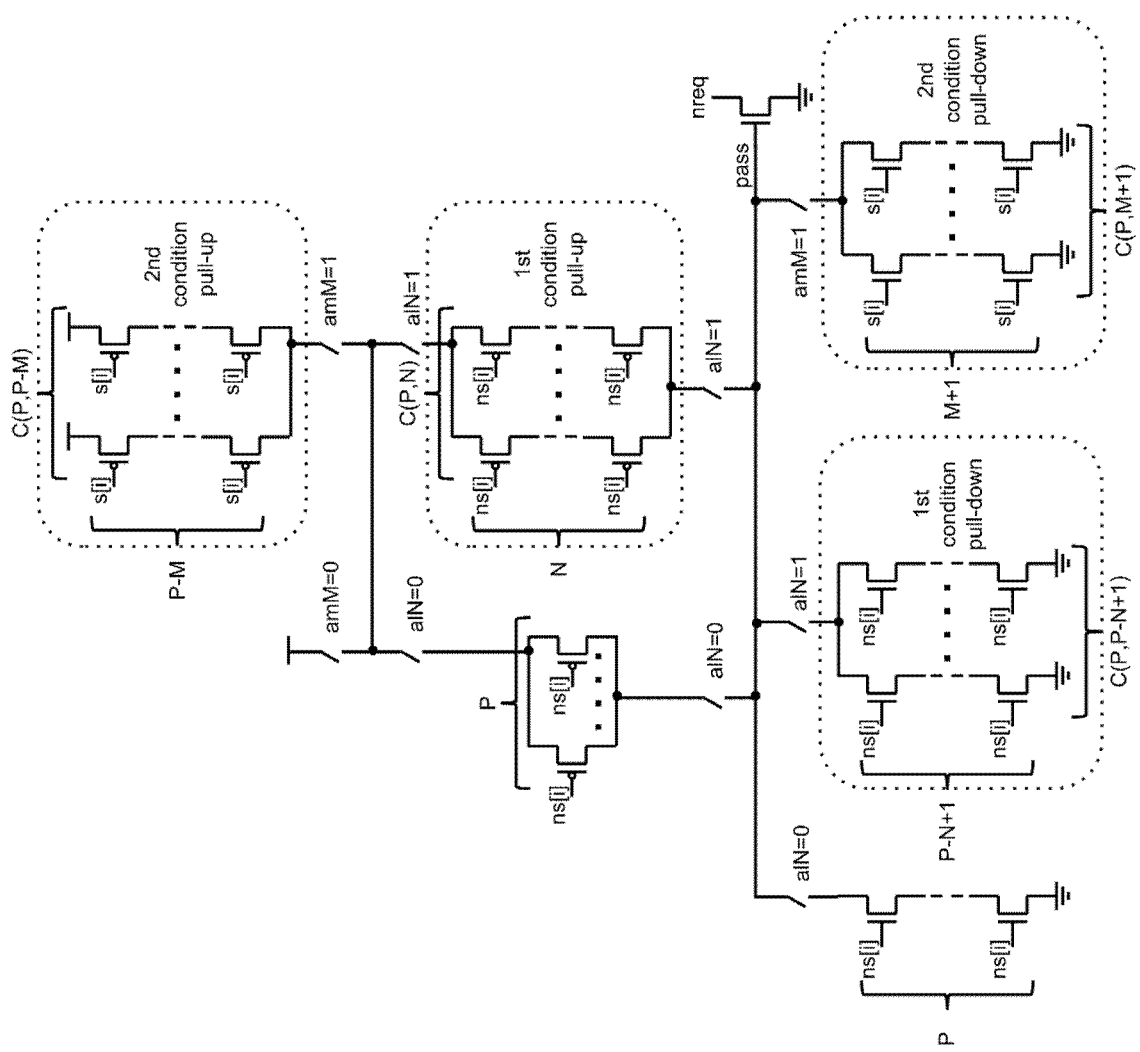
FIG. 7 shows a schematic diagram of a general form of a correlation logic in the processing unit according to one preferred embodiment.

The spatio-temporal correlation logic 3, 8, 81, 82 is implemented by combinational logic. FIG. 7 shows the general form of the spatio-temporal correlation logic circuit 3, 8, 81, 82 according to a preferred embodiment. s[i] and ns[i] denote whether there is a stored event (signed or unsigned) from each pixel i in the device cell (i∈[1,P]). s[i]=1 and ns[i]=0 both mean that there is a stored event in pixel i. alN (at-least-A) is the signal to enable/disable the 1st optional condition. amM (at-most-M) is the signal to enable/disable the 2nd optional condition. pass is the output signal of the spatio-temporal correlation logic 3, 8, 81, 82 that determines if the events stored in the group shall be sent out. nreq is the request signal for accessing the readout communication bus.

If alN=1, the 1st optional condition is enabled. The 1st optional condition is realized by a pull-up circuit and a pull-down circuit. The pull-up circuit is made of C(P,N) (N combination of P) branches, where each branch consists of N p-type transistors in series controlled by ns[i]. Each pull-up branch represents a unique combination of N pixels having ns[i]=0. Therefore, the pull-up circuit is able to set pass=1 when at least N pixels have ns[i]=0, i.e. have stored an event. The pull-down circuit is made of C(P,P−N+1) (P−N+I combination of P) branches, where each branch consists of P−N+1 n-type transistors in series controlled by ns[i]. Each pull-down branch represents a unique combination of P−N+1 pixels having ns[i]=1. Therefore, the pull-down circuit is able to set pass=0 when at least P−N+1 pixels have ns[i]=1, i.e. have not stored an event, in other words, when less than N pixels have stored an event.

If anM=1, the 2nd optional condition is enabled. The 2nd optional condition is also realized by a pull-up circuit and a pull-down circuit. The pull-up circuit is made of C(P,P−M) (P−M combination of P) branches, where each branch consists of P−M p-type transistors in series controlled by s[i]. Each pull-up branch represents a unique combination of P−M pixels having s[i]=0. Therefore, the pull-up circuit is able to set pass=1 when at least P−M pixels have s[i]=0, i.e. have not stored an event, in other words, when at most M pixels have stored an event. The pull-down circuit is made of C(P,M+1) (M+1 combination of P) branches, where each branch consists of M+1 n-type transistors in series controlled by s[i]. Each pull-down branch represents a unique combination of M+1 pixels having s[i]=1. Therefore, the pull-down circuit is able to set pass=0 when at least M+1 pixels have s[i]=1, i.e. have stored an event, in other words, when more than M pixels have stored an event.

If alN=1 and amM=1, both the 1st and the 2nd optional conditions are enabled. The two pull-up circuits of the two conditions are in series, while the two pull-down circuits of the two conditions are in parallel.

If alN=0 and amM=0, both the two optional conditions are disabled. The whole spatio-temporal correlation logic reduces into a P-input OR gate.

Figure 8:
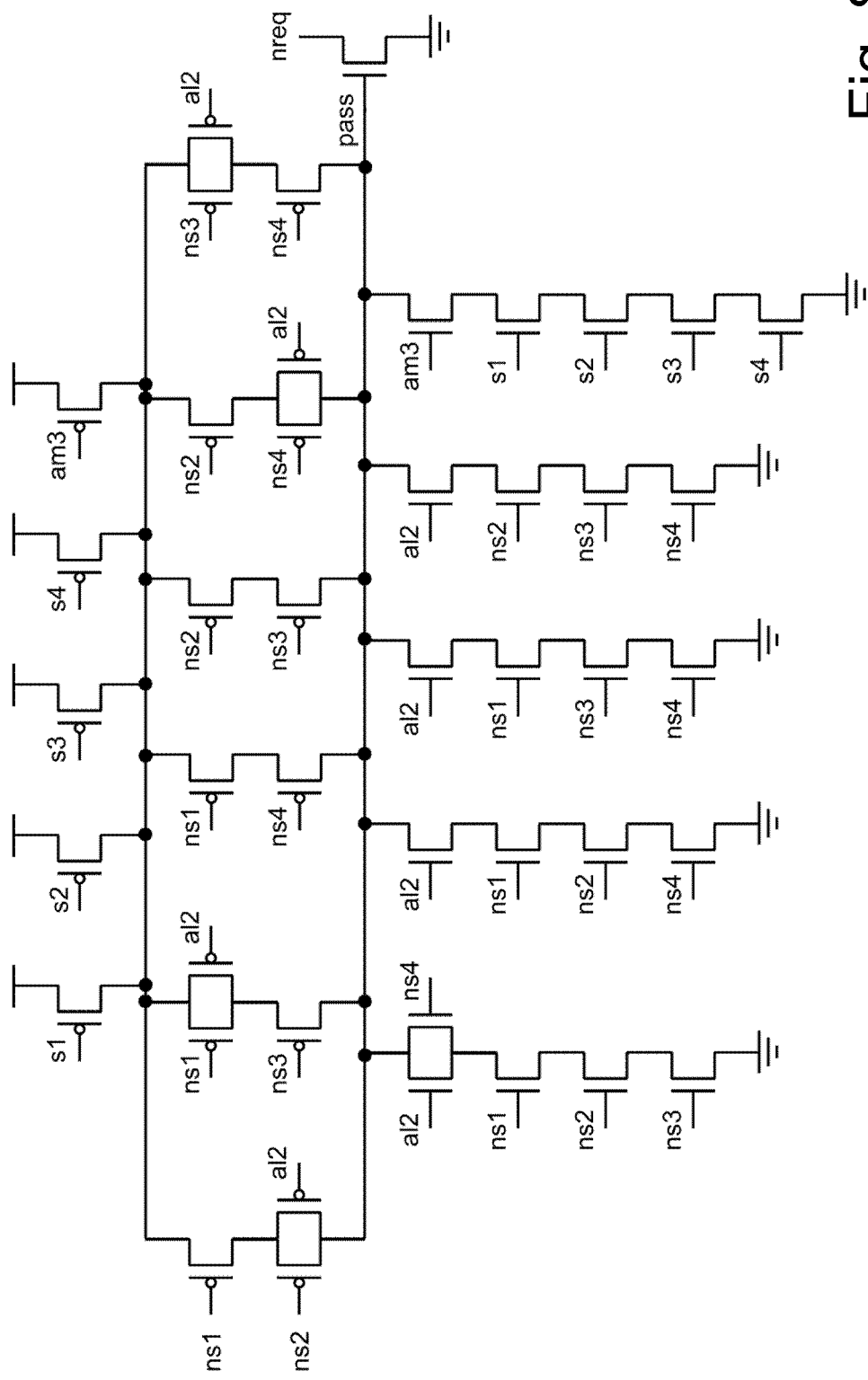
FIG. 8 shows a schematic diagram of a specific form of the correlation logic of FIG. 7.

FIG. 8 shows the schematic of a specific example of a spatio-temporal correlation logic according to the embodiment shown in general in FIG. 7, with N=2, M=3, P=4. The two configuration bits are al2 (at-least-2) and am3 (at-most-3). s1~4 and ns1~4 are the signals indicating whether there is a stored event (signed or unsigned) from each pixel in the device cell. s1~4=1 and ns1~4=0 mean that there is a stored event in pixel 1~4. The following is the truth table of the specific spatio-temporal correlation logic shown in FIG. 8.

| | | | | | pass | | |
|---|---|---|---|---|---|---|---|
| s1 | s2 | s3 | s4 | al2 = 0, am3 = 0 | al2 = 1, am3 = 0 | al2 = 0, am3 = 1 | al2 = 1, am3 = 1 |
| 0 | 0 | 0 | 0 | 0 | 0 | 0 | 0 |
| 0 | 0 | 0 | 1 | 1 | 0 | 1 | 0 |
| 0 | 0 | 1 | 0 | 1 | 0 | 1 | 0 |
| 0 | 0 | 1 | 1 | 1 | 1 | 1 | 1 |
| 0 | 1 | 0 | 0 | 1 | 0 | 1 | 0 |
| 0 | 1 | 0 | 1 | 1 | 1 | 1 | 1 |
| 0 | 1 | 1 | 0 | 1 | 1 | 1 | 1 |
| 0 | 1 | 1 | 1 | 1 | 1 | 1 | 1 |
| 1 | 0 | 0 | 0 | 1 | 0 | 1 | 0 |
| 1 | 0 | 0 | 1 | 1 | 1 | 1 | 1 |
| 1 | 0 | 1 | 0 | 1 | 1 | 1 | 1 |
| 1 | 0 | 1 | 1 | 1 | 1 | 1 | 1 |
| 1 | 1 | 0 | 0 | 1 | 1 | 1 | 1 |
| 1 | 1 | 0 | 1 | 1 | 1 | 1 | 1 |
| 1 | 1 | 1 | 0 | 1 | 1 | 1 | 1 |
| 1 | 1 | 1 | 1 | 1 | 1 | 0 | 0 |

REFERENCE NUMERALS

1 device cell
12 group of pixels
13 (primary) processing unit
2 pixel
3 correlation logic
4 storage memory
5 pixel operation logic
6 secondary storage memory
7 set of cells
8 secondary correlation logic

The invention claimed is:

1. A photoarray for detecting time-dependent image data, comprising:
an array of multiple device cells, wherein each device cell includes:
   a group of photosensors, each photosensor configured to generate an analog sensor signal dependent on a light intensity at said photosensor,
   for each photosensor a pixel encoding circuit configured to transform the analog sensor signal generated by said photosensor into a digital pixel information stemming from said photosensor, and
   a processing unit, which comprises a spatio-temporal correlation logic configured to correlate said pixel information stemming from the photosensors of said group of photosensors and to produce as a result, a request signal indicating that said cell contains pixel information to be read and/or a pass signal utilized in the processing unit to allow pixel information contained in said cell to be transmitted,
   wherein said spatio-temporal correlation logic and/or said secondary spatio-temporal correlation logic are/is configured to produce a request signal and/or a pass signal, when a correlation result of said pixel information is equal to or larger than a minimum threshold number (N) and/or smaller than or equal to a maximum threshold number (M), wherein the correlation result meets this condition when the number of pixels reporting an event in the group of pixels is equal to or larger than N and/or equal to or smaller than M.

2. The photoarray according to claim 1, wherein two or more photosensors of said group of photosensors are arranged adjacent to each other.

3. The photoarray according to claim 1, the multiple device cells are divided into multiple sets of cells and each set of cells further includes a secondary processing unit placed at an end of said set of cells, which secondary processing unit comprises a secondary spatio-temporal correlation logic configured to correlate said pixel information stemming from the photosensors of said group of photosensors of a selected cell of said cells and produce as a result, a request signal indicating that said selected cell contains pixel information to be read and/or at least one pass signal utilized in the secondary processing unit to allow pixel information contained in said selected cell to be transmitted.

4. The photoarray according to claim 1, wherein said spatio-temporal correlation logic and/or said secondary spatio-temporal correlation logic are/is implemented by combinational logic.

5. The photoarray according to claim 1, wherein said processing unit comprises for each photosensor of said group of photosensors a pixel operation logic, which is configured to receive and temporarily store pixel information stemming from said corresponding photosensor of said group and to reset and/or restart said pixel encoding circuit of said corresponding photosensor.

6. The photoarray according to claim 1, wherein:
said processing unit comprises for each photosensor of the group of photosensors an event storage memory, which is configured to store said pixel information stemming from said photosensor, and/or
said secondary processing unit comprises for each photosensor of the group of photosensors a secondary event storage memory, which is configured to store said pixel information stemming from said photosensor.

7. The photoarray according to claim 6, wherein said processing unit comprises for each photosensor of the group of photosensors a storage memory, which is configured to store said pixel information stemming from said photosensor, and said secondary processing unit comprises for each photosensor of the group of photosensors a secondary storage memory, which is configured to store said pixel information stemming from said photosensor, wherein said secondary storage memory is configured to receive said pixel information from said storage memory.

8. The photoarray according to claim 1, wherein said processing unit and/or said secondary processing unit are/is configured to receive a selection signal and in response to said selection signal to transmit, depending on said pass signal or on said at least one pass signal, pixel information that said cell or said selected cell contains to be read in a parallel fashion.

9. The photoarray according to claim 1, wherein said pixel encoding circuit is a change detection circuit, which is configured to transform the analog sensor signal generated by said photosensor into the digital pixel information, which indicate a change in the sensor signal generated by said photosensor.

* * * * *